(12) United States Patent
Cheng et al.

(10) Patent No.: US 10,644,032 B2
(45) Date of Patent: May 5, 2020

(54) FLEXIBLE DISPLAY SUBSTRATE AND FLEXIBLE DISPLAY

(71) Applicant: Boe Technology Group Co., Ltd., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 14/418,235

(22) PCT Filed: May 29, 2014

(86) PCT No.: PCT/CN2014/078805
§ 371 (c)(1),
(2) Date: Jan. 29, 2015

(87) PCT Pub. No.: WO2015/081674
PCT Pub. Date: Jun. 11, 2015

(65) Prior Publication Data
US 2016/0020226 A1 Jan. 21, 2016

(30) Foreign Application Priority Data
Dec. 6, 2013 (CN) .......................... 2013 1 0658988

(51) Int. Cl.
*H01L 27/12* (2006.01)
(52) U.S. Cl.
CPC ........ *H01L 27/1218* (2013.01); *H01L 27/124* (2013.01)
(58) Field of Classification Search
None
See application file for complete search history.

(56) References Cited

U.S. PATENT DOCUMENTS 6,974,971 B2 * 12/2005 Young ............... G02F 1/133305
257/39
7,763,957 B2 * 7/2010 Hioki ................ G02F 1/133305
257/59
(Continued)

FOREIGN PATENT DOCUMENTS

CN          1460299 A      12/2003
CN          1731597 A       2/2006
(Continued)

OTHER PUBLICATIONS

Search Report (PCT/ISA/210) for PCT/CN2014/078805, dated Jul. 22, 2014.
(Continued)

*Primary Examiner* — Abul Kalam
(74) *Attorney, Agent, or Firm* — Westman, Champlin & Koehler, P.A.

(57) ABSTRACT

The present invention discloses a flexible display substrate including a first flexible substrate and a plurality of display elements disposed on a first side of the first flexible substrate, each of the display elements including a thin film transistor. The flexible display substrate further includes a plurality of protrusions each provided on a second side of the first flexible substrate opposite to the first side and corresponding to a respective thin film transistor in a thickness direction of the first flexible substrate. A projection area of each protrusion, in the thickness direction of the first flexible substrate, on the second side of the first flexible substrate at least partially overlaps with a projection area of the thin film transistor corresponding to the protrusion, in the thickness direction of the first flexible substrate, on the second side of the first flexible substrate. In the present invention, it can avoid or alleviate the damage to the thin film transistor during bending the flexible display substrate.

13 Claims, 4 Drawing Sheets

(56) References Cited

U.S. PATENT DOCUMENTS

| | | | |
|---|---|---|---|
| 8,222,810 B2* | 7/2012 | Yan | H05K 1/028 257/40 |
| 2002/0139981 A1* | 10/2002 | Young | G02F 1/133305 257/72 |
| 2007/0235736 A1* | 10/2007 | Hioki | G02F 1/133305 257/59 |
| 2010/0141872 A1* | 6/2010 | Paek | G02F 1/133603 349/69 |
| 2011/0294244 A1* | 12/2011 | Hattori | H01L 27/1218 438/34 |
| 2015/0303388 A1* | 10/2015 | Shi | H01L 29/78603 257/72 |
| 2016/0049601 A1* | 2/2016 | Hsieh | H01L 21/78 257/40 |

FOREIGN PATENT DOCUMENTS

| CN | 1753586 A | 3/2006 |
|---|---|---|
| CN | 102969320 A | 3/2013 |
| CN | 103426904 A | 12/2013 |
| CN | 103681694 A | 3/2014 |
| EP | 0 720 419 A1 | 7/1996 |
| JP | 2002-314093 | 10/2002 |

OTHER PUBLICATIONS

Written Opinion (PCT/ISA/237) for PCT/CN2014/078805, dated Jul. 22, 2014.
English translation of Written Opinion for PCT Application No. PCT/CN2014/078805, 4 pages.
First Office Action for Chinese Patent Application No. 201310658988.6, dated Aug. 28, 2015, 13 pages.
Second Office Action, including Search Report, for Chinese Patent Application No. 201310658988.6, dated Jan. 22, 2016, 15 pages.
Third Office Action for Chinese Patent Application No. 201310658988.6, dated Mar. 28, 2016, 6 pages.
Rejection Decision for Chinese Patent Application No. 201310658988.6, dated Jul. 4, 2016, 15 pages.
Reexamination Notice for Chinese Patent Application No. 201310658988.6, dated Jun. 7, 2017, 19 pages.
Re-examination Notice for Chinese Patent Application No. 201310658988.6, dated Mar. 24, 2017, 15 pages.

* cited by examiner

FLEXIBLE DISPLAY SUBSTRATE AND FLEXIBLE DISPLAY

CROSS-REFERENCE TO RELATED APPLICATION

This Application is a Section 371 National Stage Application of International Application No. PCT/CN2014/078805, filed 29 May 2014, which has not yet published, which claims priority to Chinese Patent Application No. 201310658988.6, filed 6 Dec. 2013, in Chinese, the contents of which are hereby incorporated by reference in their entirety.

BACKGROUND OF THE INVENTION

Field of the Invention

The embodiments of the present invention relate to a flexible display substrate and a flexible display.

Description of the Related Art

A flexible display technology has developed rapidly in recent years, and there has made great progress on many aspects of the flexible display, including screen size and display quality. Both a cathode ray tube (referred to as CRT) display on the verge of disappearing, or a liquid crystal display (referred to as LCD) currently on the mainstream, is essentially a traditional rigid display. Compared with the traditional rigid display, the flexible display has many advantages, such as, strong impact resistance, strong seismic resistance, light weight, small volume, good portability, and so on.

At present, the flexible display can be divided into three types of: electronic paper (flexible electrophoretic display), flexible organic light-emitting diode (referred to as OLED), and flexible LCD. Among them, an array substrate constituting the flexible display usually comprises a gate insulating layer, an interlayer insulating layer, a passivation layer, etc., composed of a SiNx (silicon nitride) layer or a SiOx (silica) layer. However, due to the SiNx layer or the SiOx layer has bad toughness, during bending the flexible display, it is easy to cause the SiNx layer or the SiOx layer fractured, thus destroying a thin film transistor on the array substrate, and then disadvantageously affecting the display quality.

SUMMARY OF THE INVENTION

There is provided a flexible display substrate comprising a first flexible substrate and a plurality of display elements disposed on a first side of the first flexible substrate, each of the display elements comprising a thin film transistor. The flexible display substrate further comprises a plurality of protrusions each provided on a second side of the first flexible substrate opposite to the first side and corresponding to a respective thin film transistor in a thickness direction of the first flexible substrate. A projection area of each protrusion, in the thickness direction of the first flexible substrate, on the second side of the first flexible substrate at least partially overlaps with a projection area of the thin film transistor corresponding to the protrusion, in the thickness direction of the first flexible substrate, on the second side of the first flexible substrate.

There is provided a flexible display comprising the above flexible display substrate.

BRIEF DESCRIPTION OF THE DRAWINGS

In order to more clearly describe embodiments of the present invention or solutions of the prior art, hereafter, it will simply introduce drawings for describing the embodiments of the present invention or the solutions of the prior art. Obviously, these drawings herein are intended to be illustrated, and not restrictive. For example, many modifications may be made to these drawings by those skilled in this art without departing from the principles and spirit of the disclosure.

LIST OF REFERENCE NUMBERS

01—flexible display substrate; 02—flexible package substrate; 03—color filter substrate; 04—liquid crystal layer; 05—adhesive; 10—first flexible substrate; 11—display element; 20—thin film transistor; 30—second flexible substrate; 40—protrusion; 50—pixel electrode; 60—common electrode; 70—anode; 80—cathode; 90—organic material function layer; 100—OCA optical glue; 110—pixel isolation layer; 201—gate electrode; 202—gate insulation layer; 203—active layer; 204—source electrode; 205—drain electrode; 300—third flexible substrate; 310—red filter; 320—green filter; 330—blue filter.

DETAILED DESCRIPTION OF PREFERRED EMBODIMENTS OF THE INVENTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an exemplary embodiment of the present invention, there is provided a flexible display substrate 01. As shown in FIGS. 1-8, the flexible display substrate 01 comprises a first flexible substrate 10 and a plurality of display elements 11 disposed on a first side of the first flexible substrate 10, each of the display elements 11 comprising a thin film transistor 20. The flexible display substrate 01 further comprises a second flexible substrate 30 provided on a side of the first flexible substrate 10 far away from the thin film transistor 20, and a plurality of protrusions 40 provided between the first flexible substrate 10 and the second flexible substrate 30.

A projection area of any one protrusion 40 on the second flexible substrate 30 overlaps with a projection area of the thin film transistor 20 in one of the display elements 11 on the second flexible substrate 30.

Please be noted that the second flexible substrate 30 may be omitted herein, and an overlapping area of the above two projection areas also may be changed.

Thereby, in the present invention, there is provided a flexible display substrate 01 comprising a first flexible substrate 10 and a plurality of display elements 11 disposed on a first side (an upper side in drawings) of the first flexible substrate 10, each of the display elements 11 comprising a thin film transistor 20. The flexible display substrate 01 further comprises a plurality of protrusions 40 each provided on a second side (a lower side in drawings) of the first flexible substrate 10 opposite to the first side and corresponding to a respective thin film transistor 20 in a thickness direction of the first flexible substrate 10. A projection area of each protrusion 40, in the thickness direction of the first flexible substrate 10, on the second side of the first flexible substrate 10 at least partially overlaps with a projection area of the thin film transistor 20 corresponding to the protrusion 40, in the thickness direction of the first flexible substrate 10, on the second side of the first flexible substrate 10. The thin film transistor 20 comprises a gate electrode 201, a gate insulation layer 202, an active layer 203, a source electrode 204 and a drain electrode 205. In this case, the flexible display substrate 01 further comprises a gate line electrically connected to the gate electrode 201, a lead of gate line, a data line electrically connected to the source electrode 204, and a lead of data line.

Figure 1:
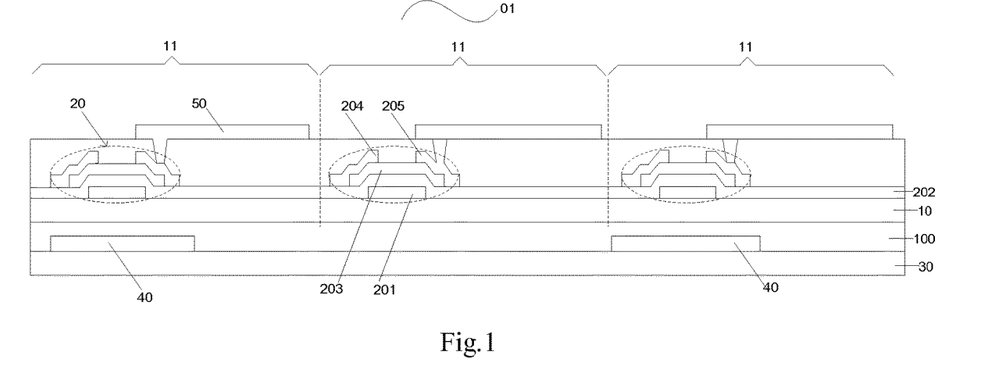
FIG. 1 is an illustrative first structure view of a flexible display substrate according to an exemplary embodiment of the present invention.
Figure 2:
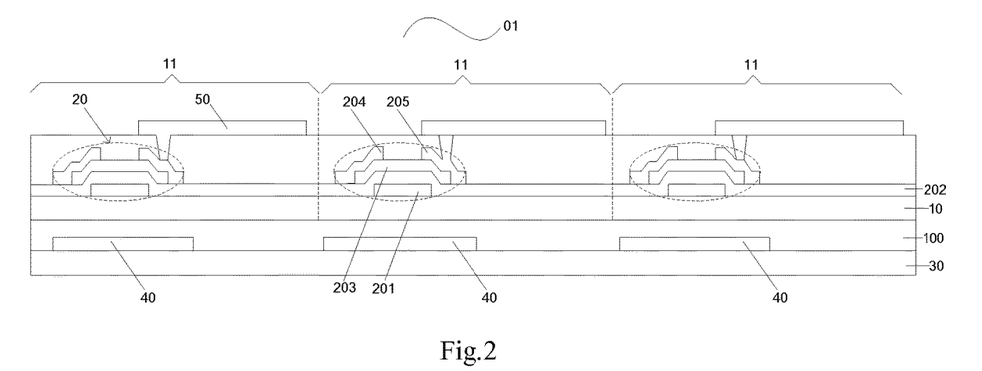
FIG. 2 is an illustrative second structure view of a flexible display substrate according to an exemplary embodiment of the present invention.
Figure 3:
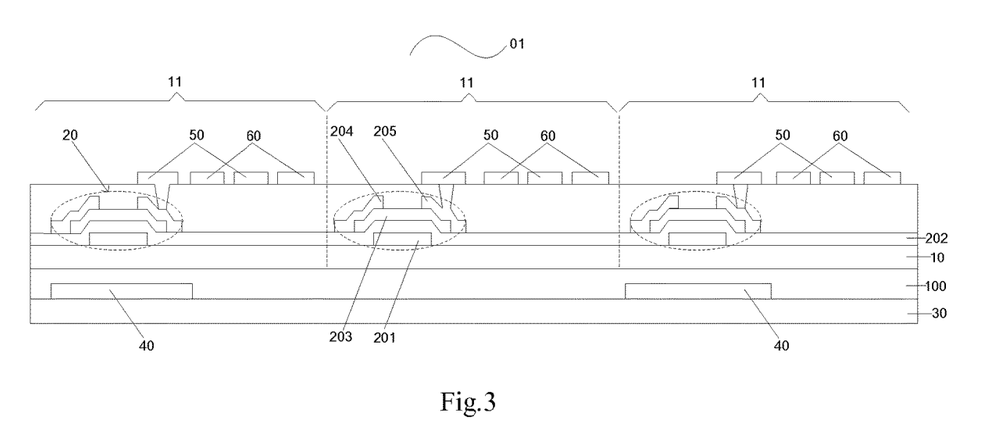
FIG. 3 is an illustrative third structure view of a flexible display substrate according to an exemplary embodiment of the present invention.
Figure 4:
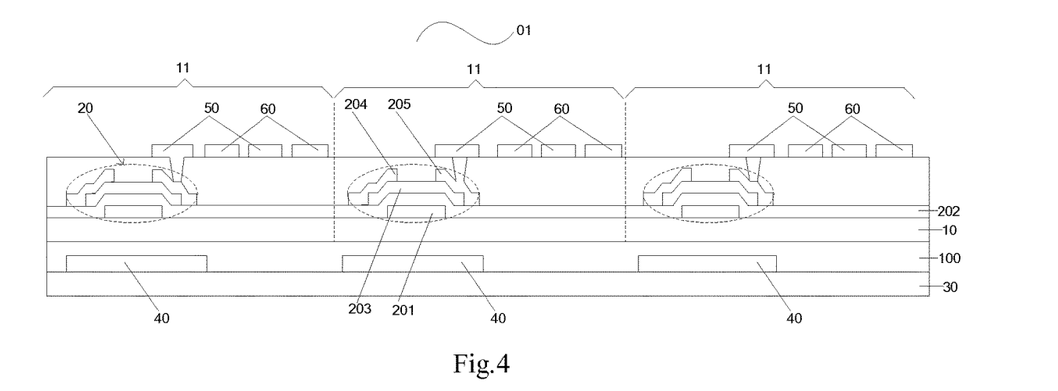
FIG. 4 is an illustrative fourth structure view of a flexible display substrate according to an exemplary embodiment of the present invention.
Figure 5:
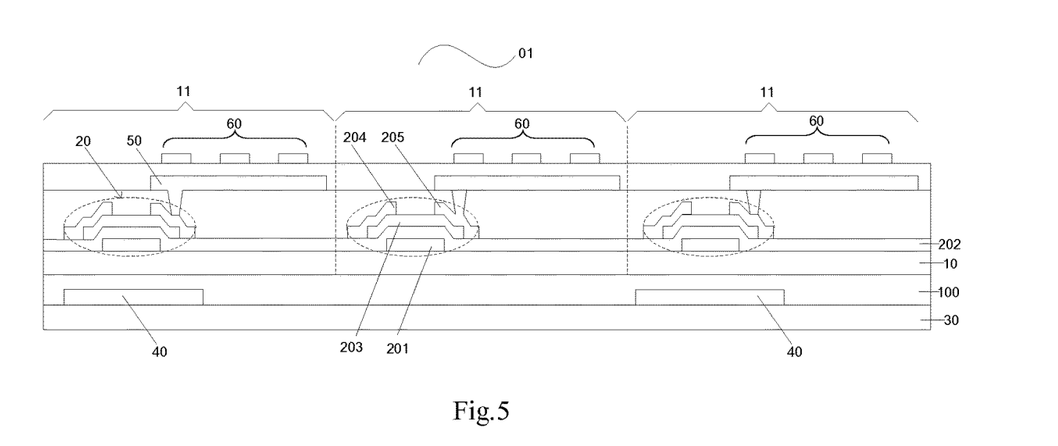
FIG. 5 is an illustrative fifth structure view of a flexible display substrate according to an exemplary embodiment of the present invention.
Figure 6:
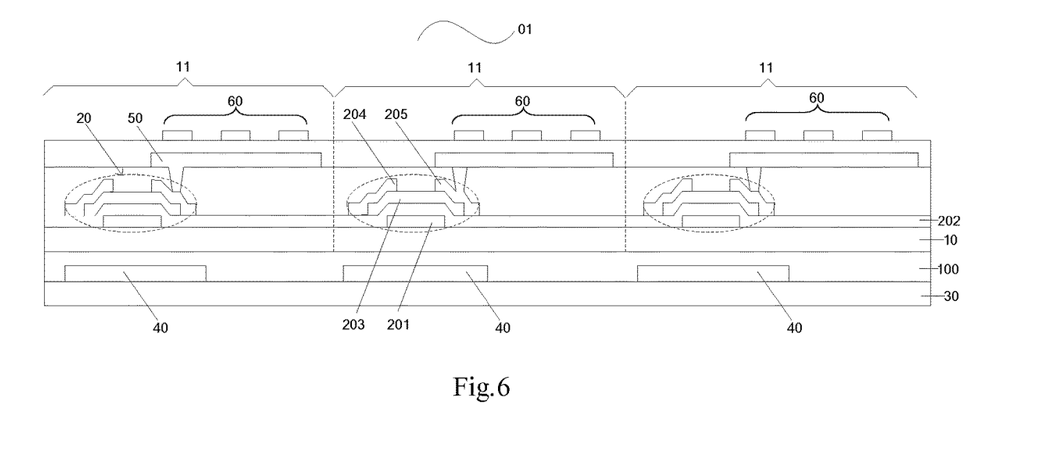
FIG. 6 is an illustrative sixth structure view of a flexible display substrate according to an exemplary embodiment of the present invention.

Also, when the flexible display substrate is an array substrate of a liquid crystal display (referred as LCD), as shown in FIGS. 1-2, the display element 11 further comprises a pixel electrode 50 connected to the drain electrode 205. Also, the display element 11 may further comprise a common electrode 60. In this case, as for an In-Plane Switch (referred as IPS) array substrate, as shown in FIGS. 3-4, the pixel electrode 50 and the common electrode 60 are spaced from each other and both are strip electrodes. As for an Advanced-super Dimensional Switching (referred as ADS) array substrate, as shown in FIGS. 5-6, the pixel electrode 50 and the common electrode 60 are arranged in different layers, and the electrode on an upper layer is a strip electrode, and the electrode on a lower layer is a plate electrode.

Figure 7:
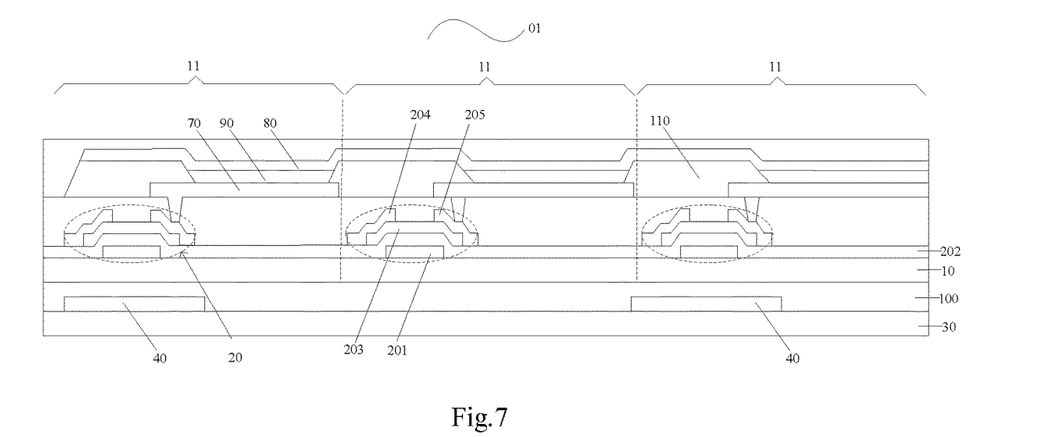
FIG. 7 is an illustrative seventh structure view of a flexible display substrate according to an exemplary embodiment of the present invention.
Figure 8:
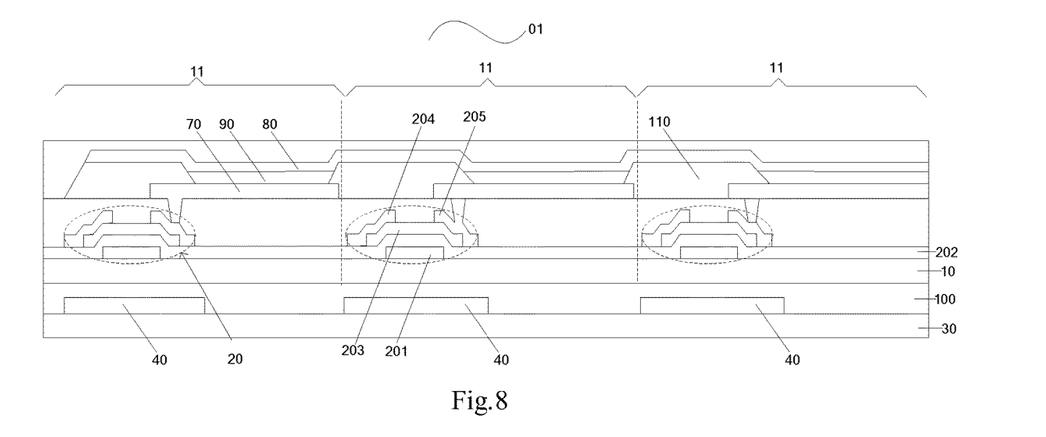
FIG. 8 is an illustrative eighth structure view of a flexible display substrate according to an exemplary embodiment of the present invention.

When the flexible display substrate is an array substrate of an Organic Light-Emitting Diode (referred as OLED), as shown in FIGS. 7-8, the display element 11 further comprise an anode 70 connected to the drain electrode 205, a cathode 80, and an organic material function layer 90 between the anode 70 and the cathode 80.

In this case, according to materials of the anode 70 and the cathode 80, the flexible display substrate may be classified into a single side light-emitting flexible display substrate and a double side light-emitting flexible display substrate. That is, when one of the anode 70 and the cathode 80 is made of opaque material, the flexible display substrate is the single side light-emitting flexible display substrate; when both the anode 70 and the cathode 80 are made of transparent material, the flexible display substrate is the double side light-emitting flexible display substrate.

According to materials of the anode 70 and the cathode 80, the single side light-emitting flexible display substrate may be further classified into an upper side light-emitting flexible display substrate and a lower side light-emitting flexible display substrate. For example, in the lower side light-emitting flexible display substrate, the anode 70 is arranged near the first flexible substrate 10 while the cathode 80 is arranged far away from the first flexible substrate 10, the anode 70 is made of transparent conductive material while the cathode 80 is made of opaque conductive material, and a light transmits through the anode 70 and is output from one side of the first flexible substrate 10; in the upper side light-emitting flexible display substrate, the anode 70 is made of opaque conductive material while the cathode 80 is made of transparent conductive material, a light transmits through the cathode 80 and is output from a package layer opposite to the first flexible substrate 10. Of course, it may be possible to exchange the relative positions of the anode 70 and cathode 80, and its description is omitted herein.

Herein, the package layer is not particularly defined, it may be the flexible package substrate, or may be a film layer.

In the double side light-emitting flexible display substrate, the anode 70 is arranged near the first flexible substrate 10 and the cathode 80 is arrange far away from the first flexible substrate 10, or the anode 70 is arranged far away from the first flexible substrate 10 and the cathode 80 is arrange near the first flexible substrate 10, and at the same time, the anode 70 and the cathode 80 both are made of transparent conductive materials, for example, Indium Tin Oxides (ITO). On one hand, a light transmits through the anode 70 and is output from one side of the first flexible substrate 10, and on the other hand, a light transmits through the cathode 80 and is output from the package layer opposite to the first flexible substrate 10, thereby the flexible display substrate is referred as the double side light-emitting flexible display substrate.

Based on above description, the display element 11 may further comprise some necessary pattern layers, such as, a protection layer, a passivation layer, an interlayer insulation layer, a pixel isolation layer 110 for isolating a pixel unit, or some other pattern layers additionally provided for improving display effect or overcoming some display defects.

Please be noted that there is a need to explain some points herein.

Firstly, in embodiments of the present invention, as for one smallest display unit in the flexible display substrate 01, the display element may be regarded as an essential structure arranged on the first flexible substrate 10 and composed of a plurality of pattern layers. Also, the flexible display substrate 01 comprises a plurality of display elements.

Secondly, the protrusions 40 may be formed by patterning process, ink jet printing, screen printing or the like.

The protrusions 40 are provided on a side (that is, the second side or the lower side in the drawings) of the first flexible substrate 10 far away from the thin film transistor 20. In this case, it means that the protrusions 40 may be directly provided on the second side of the first flexible substrate 10, or the protrusions 40 may be provided on a side of the second flexible substrate 30 near the first flexible substrate 10.

Thirdly, herein, the shape and the number of the protrusions 40 are not particularly limited, as long as the protrusions 40 can protect the thin film transistor 20 from being damaged during bending the flexible display substrate 01. Herein, regardless of the number of the protrusions 40, each of the protrusions 40 corresponds to the thin film transistor 20 of a respective one of the display elements 11.

Fourthly, the preceding terms "each of the protrusions 40 corresponds to the thin film transistor 20 of a respective one of the display elements 11" means that a projection area of any one of protrusions 40 on the second flexible substrate 30 overlaps with a projection area of the thin film transistor 20 of the respective one of display elements 11 on the second flexible substrate 30 when the second flexible substrate 30 is provided, or that a projection area of each protrusion on the second side of the first flexible substrate overlaps with a projection area of the thin film transistor corresponding to the protrusion on the second side of the first flexible substrate regardless of providing the second flexible substrate 30. Herein, the overlapping degree between the two projection areas is not particularly limited, the two projection areas may partially or wholly overlap with each other, or the larger one of the two projection areas fully covers the smaller one of them, as long as it can protect the thin film transistor 20 from being damaged during bending the flexible display substrate 01, and the protrusions 40 do not disadvantageously affect the display effect of the flexible display substrate 01.

Fifthly, the thin film transistor 20 may be a top gate type thin film transistor or a bottom gate type thin film transistor, and herein it does not need to particularly define this. The top gate type or the bottom gate type is depended on positions of the gate electrode 201 and the gate insulation layer 202. That is, when the gate electrode 201 is arranged near the first flexible substrate 10, and when the gate insulation layer 202 is arranged far away from the first flexible substrate 10, the thin film transistor is the bottom gate type thin film transistor; when the gate electrode 201 is arranged far away from the first flexible substrate 10, and when the gate insulation layer 202 is arranged near the first flexible substrate 10, the thin film transistor is the top gate type thin film transistor.

In an exemplary embodiment of the present invention, a projection area of any one of protrusions 40 on the second flexible substrate 30 overlaps with a projection area of the thin film transistor 20 of the respective one of display elements 11 on the second flexible substrate 30. In this way, during bending the flexible display substrate 01, the protrusions 40 can bear a stress generated during bending the flexible display substrate. Thereby, it can avoid or alleviate the damage to the thin film transistor 20 during bending the flexible display substrate 01.

In an embodiment, any two adjacent protrusions 40 are spaced from each other. In an embodiment of the present invention, two adjacent protrusions 40 are connected to form a group, and adjacent groups are spaced from each other.

In an embodiment of the present invention, the number of the thin film transistor may be greater than that of the protrusions, for example, the plurality of display elements 11 are numbered orderly, and the plurality of protrusions 40 correspond to the thin film transistors 20 of odd numbered or even numbered display elements 11 in the plurality of display elements 11 one by one. For example, as shown in FIGS. 1, 3, 5 and 7, the protrusions 40, corresponding to the display elements 11, may be spaced from each other, for example, the protrusions 40 are arranged along a gate line below the thin film transistors 20 of the odd numbered display elements 11, or the adjacent protrusions 40 are spaced by the thin film transistors 20 of at least two display elements 11. Herein, it does not need to particularly limit this.

The plurality of protrusions 40 may correspond to the thin film transistors 20 of the plurality of display elements 11 one by one, that is, each thin film transistor corresponds to one protrusions. As shown in FIGS. 2, 4, 6 and 8, the protrusions 40 correspond to the display elements 11 one by one, that is, there is provided one protrusion 40 below the thin film transistor 20 of any one display element 11.

In an embodiment of the present invention, the projection area of each protrusion on the second side of the first flexible substrate partially or wholly covers the projection area of the thin film transistor, corresponding to the protrusion, on the second side of the first flexible substrate. In a further embodiment, the projection area of any one of protrusions 40 on the second flexible substrate 30 is greater than the projection area of the thin film transistor 20 of the respective one of display elements 11 on the second flexible substrate 30. In an embodiment of the present invention, as shown in FIGS. 1-8, the protrusions 40 are provided on the second flexible substrate 30. The first flexible substrate 10 is adhered onto the second flexible substrate 30, on which the protrusions 40 are provided, by means of OCA optical glue 100. That is, the second flexible substrate 30 provided with the protrusions 40 and the first flexible substrate 10 provided with the display elements 11 are adhered to each other by means of OCA optical glue 100.

Based on above description, in an embodiment of the present invention, the protrusions 40 are formed in cuboid, cube, cylinder or any polyhedron other than the cuboid and the cube.

In an embodiment of the present invention, the protrusions 40 may be made of metal, such as, aluminum (Al), molybdenum (Mo) or the like, or resin, such as, polyimide, or inorganic material, such as, silicon nitride (SiNx), silicon oxide (SiOx) or the like. For example, the protrusions 40 may be formed by patterning, that is, the protrusions 40 may be formed by depositing, for example, a metal film on the second flexible substrate 30, forming a photo-resist on the metal film, and then exposing with a normal mask, etching, stripping, etc.

Considering the limitation of the patterning, and the entire thickness of the flexible display substrate 01, the protrusions 40 may have a thickness of 0.2~2 μm.

Please be noted that the forming of the protrusions 40 is not limited to the patterning, and it may be formed by other processing, and its description is omitted herein.

According to an exemplary embodiment of the present invention, there is also disclosed a flexible display comprising the above flexible display substrate 01.

The flexible display may be any product or member with a display function, such as, an electronic paper, a liquid crystal TV, a liquid crystal display, an OLED TV, an OLED display, a digital photo frame, a mobile phone, a panel computer, and so on.

Figure 9:
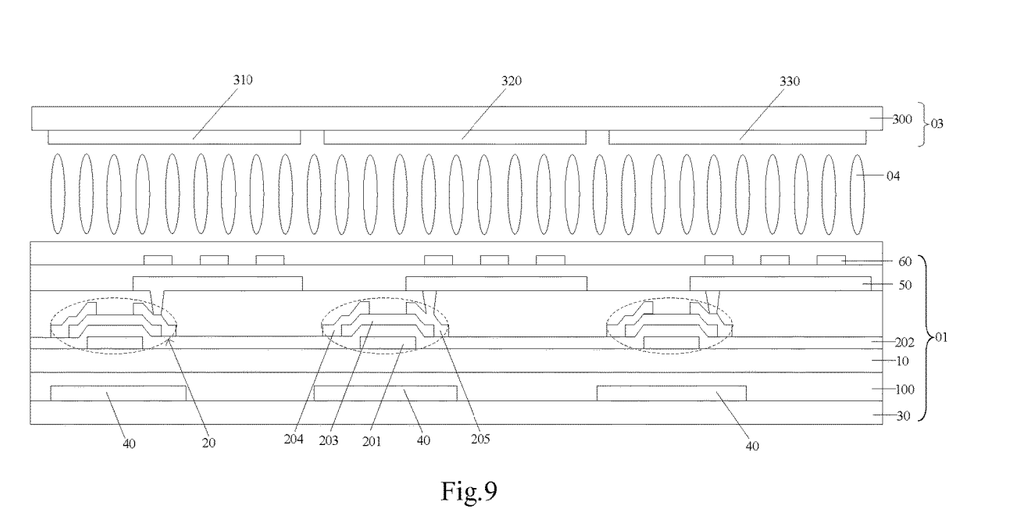
FIG. 9 is an illustrative first structure view of a flexible display according to an exemplary embodiment of the present invention.

In an embodiment of the present invention, as shown in FIG. 9, in a case where the flexible display substrate 01 is an array substrate of a liquid crystal display, that is, in a case where the flexible display substrate 01 comprises a pixel electrode 50 electrically connected to the drain electrode 205 of the thin film transistor 20, the flexible display further comprises a color filter substrate 03 and a liquid crystal layer 04.

The color filter substrate 03 comprises a third flexible substrate 300, and a color layer provided on the third flexible substrate 300. The color layer comprises a red filter 310, a green filter 320 and a blue filter 330. Of course, the color layer may further comprise a white filter, and this is not specially limited herein.

In a case where the flexible display substrate 01 does not comprise a common electrode 60, the color filter substrate 02 further comprises the common electrode 60.

Figure 10:
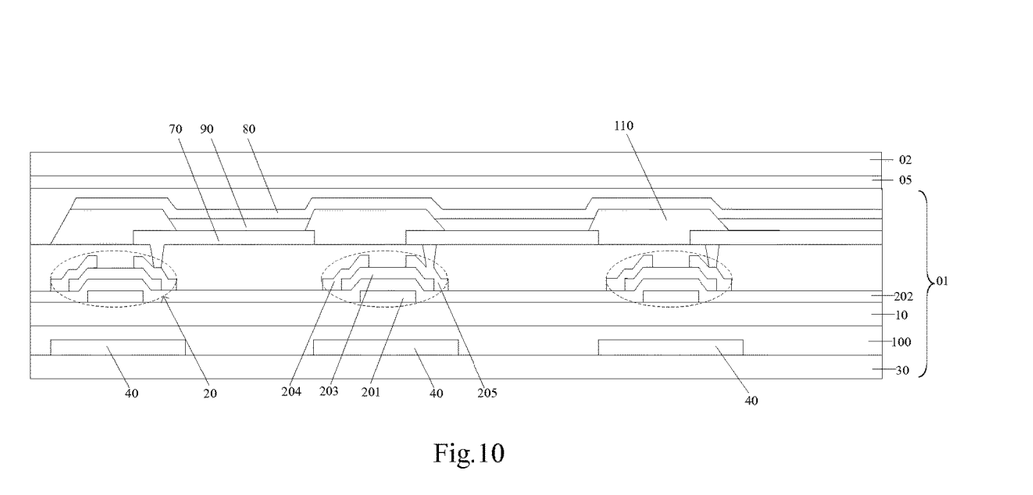
FIG. 10 is an illustrative second structure view of a flexible display according to an exemplary embodiment of the present invention.

In an embodiment of the present invention, as shown in FIG. 10, in a case where the flexible display substrate 01 is an OLED array substrate, that is, in a case where the flexible display substrate 01 comprises an anode 70 electrically connected to the drain electrode 205 of the thin film transistor 20, a cathode 80 and an organic material function layer 90, the flexible display further comprises a flexible package substrate 02. The flexible package substrate 02 is adhered to the flexible display substrate 01 by means of adhesive 05.

Since the organic material in the organic material function layer 90 and the metal material forming the electrodes are rather sensitive to oxygen and moisture, the life of the display panel is disadvantageously affected by the oxygen and moisture penetrating inside the display. Thereby, the OLED array substrate comprises the flexible package substrate 02 opposite to the first flexible substrate 10, so as to isolate the oxygen and moisture. Of course, it may be packaged with a thin film, and this is not particularly limited herein.

Hereafter, it will describe in detail the above flexible display by means of two particular embodiments.

First Embodiment

As shown in FIG. 9, there is disclosed a flexible liquid crystal display. The flexible liquid crystal display comprises a flexible display substrate 01, a color filter substrate 03, and a liquid crystal layer 04 provided between the flexible display substrate 01 and the color filter substrate 03.

The flexible display substrate 01 comprises a plurality of pixel units divided by gate lines and data lines crossing with each other on the first flexible substrate 10. Each of the pixel units comprises a display element 11 (not indicated in FIG. 9). The display element 11 comprises a thin film transistor 20, a pixel electrode 50, and a common electrode 60. The thin film transistor 20 comprises a gate electrode 201, a gate insulation layer 202, an active layer 203, a source electrode 204 and a drain electrode 205. The pixel electrode 50 is electrically connected to the drain electrode 205. The pixel electrode 50 is a plate electrode, and the common electrode 60 is a strip electrode above the pixel electrode 50.

The color filter substrate 03 comprises a third flexible substrate 300, and a color layer provided on the third flexible substrate 300. The color layer comprises a red filter 310, a green filter 320, and a blue filter 330. The red filter 310, the green filter 320 and the blue filter 330 are circularly arranged along the gate line, and correspond to the pixel units of the flexible display substrate 01 one by one.

Based on this, the flexible display substrate 01 further comprises a second flexible substrate 30 and a plurality of protrusions 40 provided on the second flexible substrate 30. A side of the first flexible substrate 10 far away from the thin film transistor 20 is adhered onto a side, on which the protrusions 40 are provided, of the second flexible substrate 30 by means of OCA optical glue 100. There is provided one protrusion 40 below the thin film transistor 20 of any one of the display elements 11, and a projection area of the protrusion 40 on the second flexible substrate 30 is larger than a projection area of the thin film transistor 20 on the second flexible substrate 30.

Also, in this embodiment, the protrusions 40 are made of polyimide, exhibit a cuboid shape, and have a thickness of 1 μm.

In the flexible liquid crystal display according to the embodiment of the present invention, the protrusions 40 bear a stress generated during bending the flexible liquid crystal display. Thereby, it can protect the thin film transistor 20 from being damaged due to the stress generated during bending the flexible liquid crystal display.

Second Embodiment

As shown in FIG. 10, there is disclosed a flexible organic light-emitting diode display. The flexible organic light-emitting diode display comprises a flexible display substrate 01 and a flexible package substrate 02. The flexible package substrate 02 is adhered to the flexible display substrate 01 by means of adhesive 05.

The flexible display substrate 01 comprises a plurality of pixel units, and each of the pixel units comprises a display element 11 (not indicated in FIG. 9). The display element 11 comprises a thin film transistor 20, an anode 70, a cathode 80, and an organic material function layer 90 between the anode 70 and the cathode 80. The adjacent pixel units are isolated from each other by a pixel isolation layer 110 above the thin film transistor 20.

The thin film transistor 20 comprises a gate electrode 201, a gate insulation layer 202, an active layer 203, a source electrode 204 and a drain electrode 205. The anode 70 is electrically connected to the drain electrode 205. The cathode 80 is located above the anode 70. The anode 70 is made of transparent material, and the cathode 80 is made of opaque material. The organic material function layer 90 at least comprises an electron transport layer, a light-emitting layer and a hole transport layer. In order to increase the efficiency to inject the electrons and the holes into the light-emitting layer, the organic material function layer 90 may further comprise an electron injection layer provided between the cathode 80 and the electron transport layer, and a hole injection layer provided between the anode 70 and the hole transport layer.

Based on above, the flexible display substrate 01 further comprises a second flexible substrate 30 and a plurality of protrusions 40 provided on the second flexible substrate 30. A side of the first flexible substrate 10 far away from the thin film transistor 20 is adhered onto a side, on which the protrusions 40 are provided, of the second flexible substrate 30 by means of OCA optical glue 100. There is provided one protrusion 40 below the thin film transistor 20 of any one of the display elements 11, and a projection area of the protrusion 40 on the second flexible substrate 30 is greater than a projection area of the thin film transistor 20 on the second flexible substrate 30.

Also, in this embodiment, the protrusions 40 are made of polyimide, exhibit a cuboid shape, and have a thickness of 1 μm.

In the flexible organic light-emitting diode display according to the embodiment of the present invention, the protrusions 40 bear a stress generated during bending the flexible organic light-emitting diode display. Thereby, it can protect the thin film transistor 20 from being damaged due to the stress generated during bending the flexible organic light-emitting diode display.

Based on above description, it should be appreciated for those skilled in this art that all drawings in the embodiments of the present are only simple illustrative views of the flexible display substrate and the flexible display, and it is only tended to clearly describe structures related to the gist of the present invention in the embodiments, and other structures not related to the gist of the present invention may be any structure in prior art and may be not shown or partially shown in the drawings.

The above description regarding the embodiments of the present invention is only for illustration rather than limitation, and the scope of the present invention is defined in the attached claims.

This application claims the benefit of Chinese Patent Application No. 201310658988.6 filed on Dec. 6, 2013 in the State Intellectual Property Office of China, the whole disclosure of which is incorporated herein by reference.

What is claimed is:

1. A flexible display substrate comprising:
   a first flexible substrate and a plurality of display elements disposed on a first side of the first flexible substrate, each of the display elements comprising a thin film transistor, wherein the flexible display substrate further comprises;
   a second flexible substrate adhered onto a second side of the first flexible substrate by means of a layer of OCA optical glue, such that the first flexible substrate is separated from the second flexible substrate by the layer of OCA optical glue, the second side of the first flexible substrate being opposite to the first side of the first flexible substrate; and
   a plurality of protrusions directly disposed on a side of the second flexible substrate facing the first flexible substrate, the plurality of protrusions separated from the first flexible substrate, the plurality of protrusions and the plurality of display elements are in one-to-one correspondence;
   wherein, viewed along the thickness direction of the first flexible substrate, each protrusion overlaps with the thin film transistor corresponding to the protrusion, and no protrusion is provided at a location of the second flexible substrate which overlaps a location of the first flexible substrate where no thin film transistor is formed.

2. The flexible display substrate according to claim 1, wherein:
   any two adjacent protrusions are spaced from each other.

3. The flexible display substrate according to claim 1, wherein:
   the protrusions are formed of polyhedron.

4. The flexible display substrate according to claim 1, wherein:
   the protrusions have a thickness of 0.2~2 μm.

5. The flexible display substrate according to claim 1, wherein:
   the protrusions are made of aluminum, molybdenum, polyimide, silicon nitride or silicon oxide.

6. The flexible display substrate according to claim 1, wherein:
   the projection area of each protrusion on the second side of the first flexible substrate partially or wholly overlaps with the projection area of the thin film transistor corresponding to the protrusion on the second side of the first flexible substrate.

7. The flexible display substrate according to claim 6, wherein:
   the projection area of the protrusion on the second side of the first flexible substrate is larger than the projection area of the thin film transistor on the second side of the first flexible substrate.

8. The flexible display substrate according to claim 1, wherein:
   the display element further comprises a pixel electrode electrically connected to a drain electrode of the thin film transistor.

9. The flexible display substrate according to claim 1, wherein:
   the display element further comprises an anode electrically connected to the drain electrode of the thin film transistor, a cathode, and an organic material function layer between the anode and the cathode.

10. A flexible display comprising the flexible display substrate according to claim 1.

11. The flexible display according to claim 10, wherein:
    the display element further comprises a pixel electrode electrically connected to a drain electrode of the thin film transistor; and
    the flexible display further comprises a color filter substrate.

12. The flexible display according to claim 10, wherein:
    the display element further comprises an anode electrically connected to the drain electrode of the thin film transistor, a cathode, and an organic material function layer between the anode and the cathode; and
    the flexible display further comprises a flexible package substrate adhered onto the flexible display substrate by means of an adhesive.

13. The flexible display according to claim 10, wherein:
    any two adjacent protrusions are spaced from each other.

* * * * *